(12) United States Patent
Kim et al.

(10) Patent No.: US 11,690,278 B2
(45) Date of Patent: Jun. 27, 2023

(54) LASER ABLATION APPARATUS AND METHOD OF MANUFACTURING DISPLAY DEVICE

(71) Applicant: Samsung Display Co., Ltd., Yongin-Si (KR)

(72) Inventors: Joon Hyung Kim, Yongin-si (KR); Young Su Chae, Yongin-si (KR); Woo Hyun Kim, Yongin-si (KR); Seung Jun Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 974 days.

(21) Appl. No.: 16/406,250

(22) Filed: May 8, 2019

(65) Prior Publication Data

US 2020/0083449 A1 Mar. 12, 2020

(30) Foreign Application Priority Data

Sep. 11, 2018 (KR) .......................... 10-2018-0108470

(51) Int. Cl.
| | | |
|---|---|---|
| *H01L 51/00* | (2006.01) | |
| *H01S 3/16* | (2006.01) | |
| *H01S 3/23* | (2006.01) | |
| *G02B 27/10* | (2006.01) | |
| *H01L 51/56* | (2006.01) | |

(Continued)

(52) U.S. Cl.
CPC .......... *H01L 51/003* (2013.01); *B23K 26/342* (2015.10); *G02B 27/10* (2013.01); *H01L 27/3244* (2013.01); *H01L 51/0097* (2013.01); *H01L 51/56* (2013.01); *H01S 3/1618* (2013.01); *H01S 3/1643* (2013.01);
(Continued)

(58) Field of Classification Search
USPC ...................................................... 156/272.8
See application file for complete search history.

(56) References Cited

U.S. PATENT DOCUMENTS

| | | |
|---|---|---|
| 6,955,956 B2 | 10/2005 | Tanaka et al. |
| 9,362,532 B2 | 6/2016 | Lee |

(Continued)

FOREIGN PATENT DOCUMENTS

| | | |
|---|---|---|
| CN | 1362728 A | 8/2002 |
| CN | 1841662 A | 10/2006 |

(Continued)

OTHER PUBLICATIONS

Chinese Office Action dated Oct. 24, 2022 with respect to the Chinese Patent Application No. 201910835492.9 filed on Sep. 5, 2019.

*Primary Examiner* — Tuan N Nguyen
(74) *Attorney, Agent, or Firm* — Innovation Counsel LLP

(57) ABSTRACT

A laser ablation apparatus includes: a laser beam generator including beam sources for generating laser beams, the laser beam generator using a solid-state laser; an output beam generator for generating an output beam using the laser beams; and a substrate stage including at least one stage on which a carrier substrate formed on the front of a panel substrate is disposed. The output beam generator may include: mixers for generating mixed laser beams having two linear-polarizations orthogonal to each other by mixing the laser beams; and a photo molding machine for generating the output beam using the mixed laser beams.

19 Claims, 10 Drawing Sheets

(51) Int. Cl.
*H01L 27/32* (2006.01)
*B23K 26/342* (2014.01)

(52) U.S. Cl.
CPC ...... *H01S 3/2383* (2013.01); *H01L 2227/326* (2013.01); *H01L 2251/5338* (2013.01)

(56) References Cited

U.S. PATENT DOCUMENTS

| | | | |
|---|---|---|---|
| 9,472,650 | B2 | 10/2016 | Koo et al. |
| 10,026,930 | B2 | 7/2018 | Asakawa |
| 2005/0041697 | A1* | 2/2005 | Seifert .................. H01S 3/0941 372/6 |
| 2008/0067155 | A1* | 3/2008 | Gu .................... B23K 26/0622 219/121.61 |
| 2009/0238223 | A1 | 9/2009 | Kawakami et al. |
| 2013/0126573 | A1* | 5/2013 | Hosseini ............ B23K 26/0006 225/2 |
| 2014/0054275 | A1 | 2/2014 | Nakamae et al. |
| 2015/0246412 | A1* | 9/2015 | Mendes ............. B23K 26/0006 219/121.7 |

FOREIGN PATENT DOCUMENTS

| | | |
|---|---|---|
| CN | 103189160 A | 7/2013 |
| CN | 104078339 A | 10/2014 |
| JP | H0929467 A | 2/1997 |
| JP | 2006-253571 A | 9/2006 |
| JP | 2012-032666 A | 2/2012 |
| JP | 2014-161889 A | 9/2014 |
| JP | 2015-066590 A | 4/2015 |
| KR | 10-2011-0068352 A | 6/2011 |
| KR | 10-2014-0069706 A | 6/2014 |
| KR | 10-1600913 B1 | 3/2016 |
| KR | 10-2016-0049382 A | 5/2016 |
| KR | 10-2016-0090455 A | 8/2016 |
| KR | 10-2017-0104046 A | 9/2017 |
| KR | 10-2017-0104048 A | 9/2017 |

* cited by examiner

US 11,690,278 B2

LASER ABLATION APPARATUS AND METHOD OF MANUFACTURING DISPLAY DEVICE

CROSS-REFERENCE TO RELATED APPLICATION

The present application claims priority under 35 U.S.C. § 119(a) to Korean patent application 10-2018-0108470 filed on Sep. 11, 2018 in the Korean Intellectual Property Office, the entire disclosure of which is incorporated herein by reference.

BACKGROUND

1. Technical Field

The present disclosure generally relates to a laser ablation apparatus using a solid-state laser and a method of manufacturing a display device.

2. Related Art

An organic light emitting display device may be implemented as a flexible display using a plastic substrate having excellent flexibility.

However, since a flexible substrate has high flexibility, the flexible substrate should be supported during a manufacturing process of a display device. Therefore, after a flexible substrate is formed on a carrier substrate formed of a material such as glass, a manufacturing process of a flat panel display device is performed, and the carrier substrate is then removed.

The carrier substrate may be removed using various methods, and studies on a laser lift-off method using laser have been actively conducted.

SUMMARY

Embodiments provide a laser ablation apparatus using a solid-state laser and a method of manufacturing a display device.

According to an aspect of the present disclosure, there is provided a laser ablation apparatus including: a laser beam generator including beam sources for generating laser beams, the laser beam generator using a solid-state laser; an output beam generator configured to generate an output beam using the laser beams; and a substrate stage including at least one stage in which a carrier substrate on which a panel substrate is formed is disposed, wherein the output beam generator includes: mixers configured to generate mixed laser beams having two linear-polarizations orthogonal to each other by mixing the laser beams; and a photo molding machine configured to generate the output beam using the mixed laser beams.

The substrate stage may include a plurality of stages.

The substrate stage may further include a moving unit configured to move the plurality of stages to a laser incident area along a first moving guide. The plurality of stages may move along a second moving guide in the laser incident area while the output beam is incident. The first moving guide may extend along a first direction, and the second moving guide may extend along a second direction different from the first direction.

The laser ablation apparatus may further include a chamber configured to seal the at least one stage from the outside.

The photo molding machine may include a homogenizer configured to homogenize the mixed laser beams.

The output beam may be configured to incident onto the back of the carrier substrate.

The panel substrate may include polyamide or polyimide.

The beam sources may include a laser including an ytterbium:yttrium aluminum garnet (Yb:YAG) component.

The wavelength of the laser beams may belong to a range of 270 nm to 410 nm.

The laser beam generator may include even numbered beam sources.

The laser beam generator may include four beam sources.

According to an aspect of the present disclosure, there is provided a method of manufacturing a display device, the method including: forming a panel substrate on the front of a carrier substrate; forming a display element layer, a thin film encapsulation layer, and an upper protective layer on the front of the panel substrate; disposing the carrier substrate on a stage in a state in which the carrier substrate is overturned; irradiating, by an output beam generator, an output beam onto the back of the carrier substrate; and ablating the panel substrate from the carrier substrate, wherein the irradiating the output beam includes: generating, by a laser beam generator, laser beams, using a solid-state laser; and generating, by the output beam generator, the output beam using the laser beams.

The output beam generator may include: mixers configured to generate mixed laser beams having two linear-polarizations orthogonal to each other by mixing the laser beams; and a photo molding machine configured to generate the output beam using the mixed laser beams.

The method may further include sealing, by a chamber, the stage from the outside.

The method may further include forming a lower protective layer on the back of the panel substrate.

The laser beam generator may include a laser including an ytterbium:yttrium aluminum garnet (Yb:YAG) component.

The output beam may be incident onto the back of the carrier substrate along a normal direction.

The laser beam generator may include four beam sources.

In the laser ablation apparatus and the method of manufacturing the display device according to the present disclosure, performance and operating ratio can be improved, and maintenance cost can be reduced.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
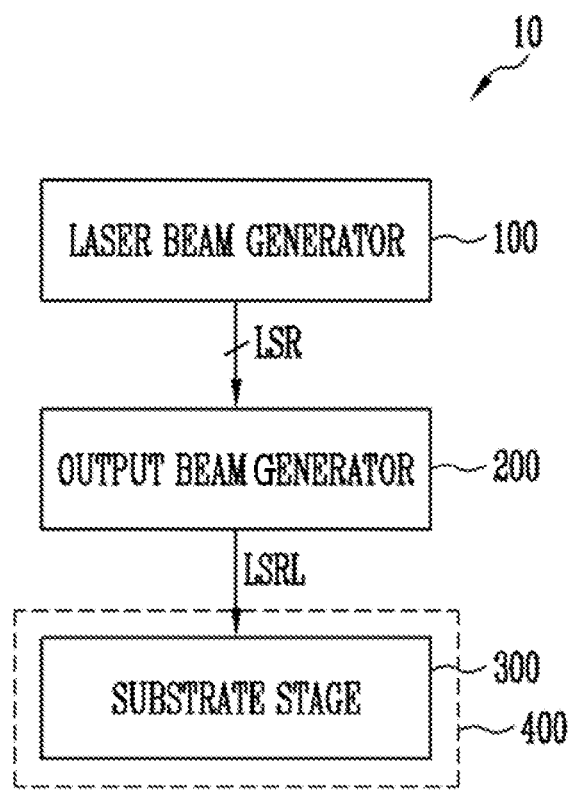
FIG. 1 is a diagram illustrating a laser ablation apparatus according to an embodiment of the present disclosure.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

Like numbers refer to like elements throughout, and duplicative descriptions thereof may not be provided. The thicknesses, ratios, and dimensions of elements may be exaggerated in the drawings for clarity. As used herein, the term "and/or" includes any and all combinations of one or more of the associated listed items.

It will be understood that, although the terms "first," "second," etc. may be used herein to describe one or more elements, these terms should not be construed as limiting such elements. These terms are only used to distinguish one element from another element. Thus, a first element could be alternately termed a second element without departing from the spirit and scope of the present disclosure. Similarly, a second element could be alternately termed a first element. Singular forms of terms are intended to include the plural forms as well, unless the context clearly indicates otherwise.

Moreover, spatially relative terms, such as "beneath," "below," "lower," "above," "upper," and the like may be used herein for ease of description to describe one element's spatial relationship to another element(s) as illustrated in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be further understood that the terms "includes" and "including," when used in this disclosure, specify the presence of stated features, integers, acts, operations, elements, and/or components, but do not preclude the presence or addition of one or more other features, integers, steps, operations, elements, components, and/or groups thereof.

In the entire specification, when an element is referred to as being "connected" or "coupled" to another element, it can be directly connected or coupled to the another element or be indirectly connected or coupled to the another element with one or more intervening elements interposed therebetween. Further, some of the elements that are not essential to the complete understanding of the disclosure are omitted for clarity. Also, like reference numerals refer to like elements throughout.

FIG. 1 is a diagram illustrating a laser ablation apparatus 10 according to an embodiment of the present disclosure.

Referring to FIG. 1, the laser ablation apparatus 10 may include a laser beam generator 100, an output beam generator 200, a substrate stage 300, and a chamber 400.

The laser beam generator 100 may generate laser beams LSR. For example, the laser beam generator 100 may generate the laser beams LSR using a solid-state laser. In some embodiments, the number of laser beams LSR may be an even number. The laser beam generator 100 may supply the laser beams LSR to the output beam generator 200.

The output beam generator 200 may be supplied with the laser beams LSR. The output beam generator 200 may generate an output beam LSRL using the laser beams LSR. For example, the output beam LSRL may have a linear shape (or rectangular shape) having a major axis length and a minor axis length. The output beam generator 200 may supply the output beam LSRL to the substrate stage 300. The major axis length may mean a line length, and the minor axis length may mean a line width.

The substrate stage 300 may include at least one stage. Detailed contents related to this will be described with reference to FIG. 5.

The chamber 400 may provide an environment for performing a process. For example, the chamber 400 may provide a space in which the substrate stage 300 can be disposed, and provide a vacuum environment, an environment for blocking air from an outside of the chamber 400, etc. That is, the chamber 400 may seal at least one stage from the outside.

Specifically, the chamber 400 may seal at least one stage from the outside so as to prevent ozone gas generated due to high output ultraviolet radiation from being released to the outside.

Figure 2:
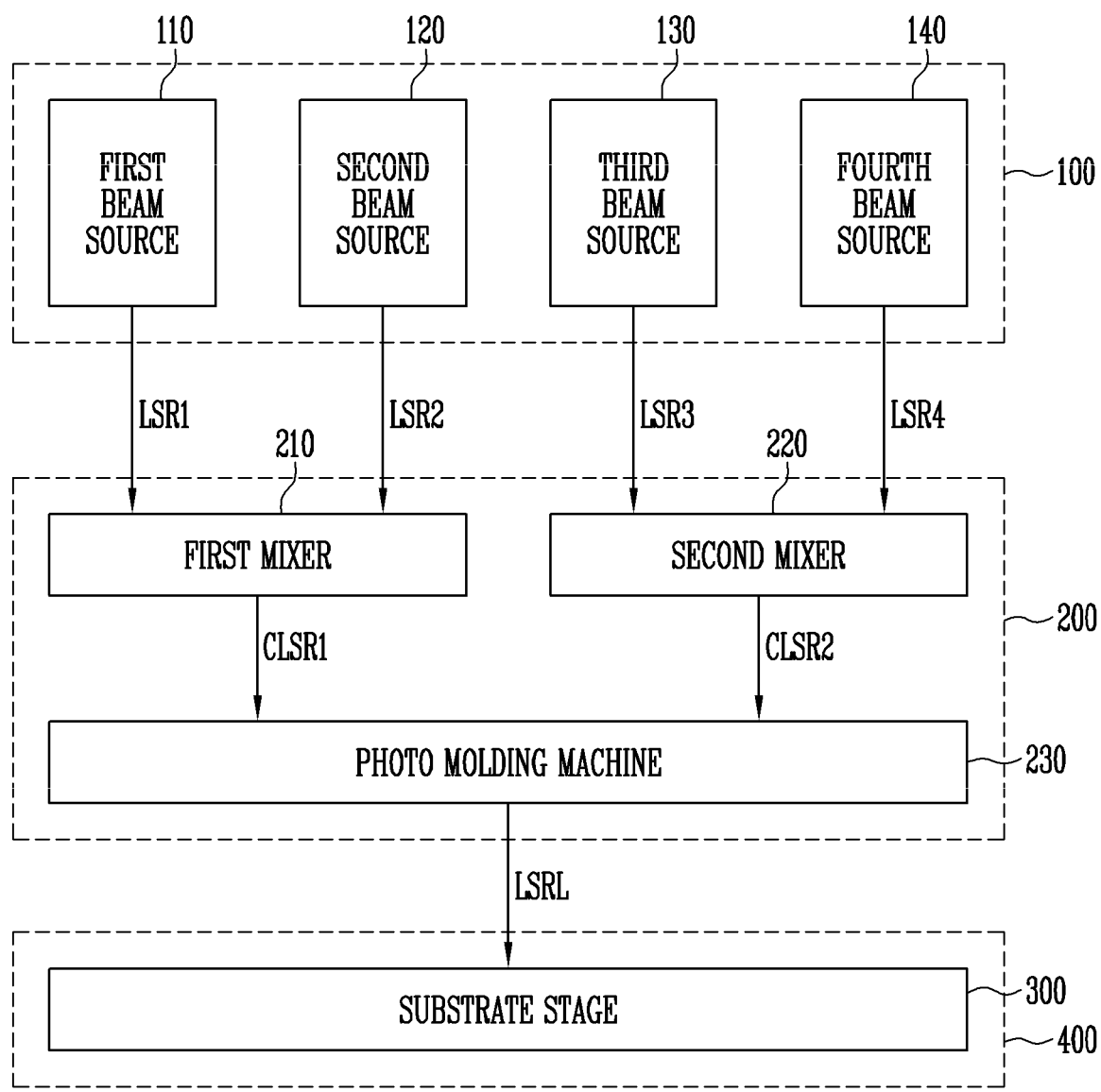
FIG. 2 is a diagram illustrating in detail the laser ablation apparatus according to an embodiment of the present disclosure.

FIG. 2 is a diagram illustrating in detail the laser ablation apparatus 10 according to an embodiment of the present disclosure.

Referring to FIG. 2, the laser beam generator 100 may include a first beam source 110, a second beam source 120, a third beam source 130, and a fourth beam source 140.

The first beam source 110 may generate a first laser beam LSR1, the second beam source 120 may generate a second laser beam LSR2, the third beam source 130 may generate a third laser beam LSR3, and the fourth beam source 140 may generate a fourth laser beam LSR4.

For example, the first beam source 110, the second beam source 120, the third beam source 130, and the fourth beam source 140 may respectively generate the first to fourth laser beams LSR1, LSR2, LSR3, and LSR4 using solid-state lasers, respectively.

In some embodiments, the first to fourth beam sources 110, 120, 130, and 140 may include a third harmonic laser including an ytterbium:yttrium aluminum garnet (Yb:YAG) component.

In some embodiments, the first to fourth beam sources 110, 120, 130, and 140 may include a third harmonic laser including a neodymium:yttrium aluminum garnet (Nd:YAG) component.

Each of the first to fourth beam sources 110, 120, 130, and 140 may have one linear-polarization, respectively.

Specifically, the reason why the first to fourth beam sources 110, 120, 130, and 140 has the linear-polarization is as follows. An initial laser beam generated by the solid-state laser may have a wavelength of 1000 nm or more. A harmonic generation scheme is used to obtain a laser beam having a desired waveform, and therefore, the wavelength of the initial laser beam may be changed to 1/n of the initial laser beam (n is a natural number) after the harmonic generation scheme is used.

When the wavelength of the initial laser beam is changed to the 1/n of the initial laser beam (n is a natural number), a resultant laser beam may have the linear-polarization. The laser beam having the linear-polarization may be a laser beam from which separate coherence is not eliminated. A laser ablation apparatus using a plurality of beam sources that generate the laser beam having the linear-polarization may leave an interference pattern in a panel substrate, etc. after ablation.

The first beam source 110 may supply the first laser beam LSR1 to the output beam generator 200. The second beam source 120 may supply the second laser beam LSR2 to the output beam generator 200. The third beam source 130 may supply the third laser beam LSR3 to the output beam generator 200. The fourth beam source 140 may supply the fourth laser beam LSR4 to the output beam generator 200.

The output beam generator 200 may include a first mixer 210, a second mixer 220, and a photo molding machine.

The first mixer 210 may be supplied with the first laser beam LSR1 and the second laser beam LSR2. The second mixer 220 may be supplied with the third laser beam LSR3 and the fourth laser beam LSR4. The first mixer 210 may generate a first mixed laser beam CLSR1 using the first laser beam LSR1 and the second laser beam LSR2. The second mixer 220 may generate a second mixed laser beam CLSR2 using the third laser beam LSR3 and the fourth laser beam LSR4.

Each of the first mixed laser beam CLSR1 and the second mixed laser beam CLSR2 may have linear-polarizations orthogonal to each other. Detailed contents related to this will be described with reference to FIG. 3.

In some embodiments, each of the first mixer 210 and the second mixer 220 may include at least one of a phase retarder, a polarizer, a lens, and a mirror.

The first mixer 210 may supply the first mixed laser beam CLSR1 to the photo molding machine 230. The second mixer 220 may supply the second mixed laser beam CLSR2 to the photo molding machine.

The photo molding machine 230 may generate an output beam LSRL using the first mixed laser beam CLSR1 and the second mixed laser beam CLSR2. The photo molding machine 230 may supply the output beam LSRL to the substrate stage 300.

Figure 3:
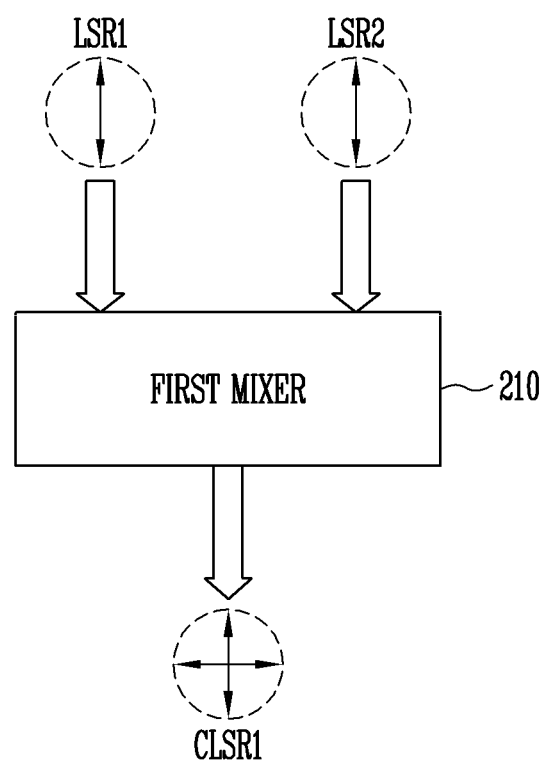
FIG. 3 is a diagram illustrating a mixer according to an embodiment of the present disclosure.

FIG. 3 is a diagram illustrating a mixer according to an embodiment of the present disclosure.

For convenience of description, the first mixer 210 is representatively illustrated in FIG. 3. Contents of the first mixer 210, which are described below, may be applied to the second mixer 220 shown in FIG. 2.

Referring to FIG. 3, the first mixer 210 may be supplied with a first laser beam LSR1 and a second laser beam LSR2.

Each of the first laser beam LSR1 and the second laser beam LSR2 may have one linear-polarization as shown in FIG. 3.

In some embodiments, the first mixer 210 may rotate the polarization direction of any one of the first laser beam LSR1 and the second laser beam LSR2 by 90 degrees, and mix the first laser beam LSR1 and the second laser beam LSR2.

Therefore, the first mixer 210 may generate a first mixed laser beam CLSR1 having two linear-polarizations orthogonal to each other.

Figure 4:
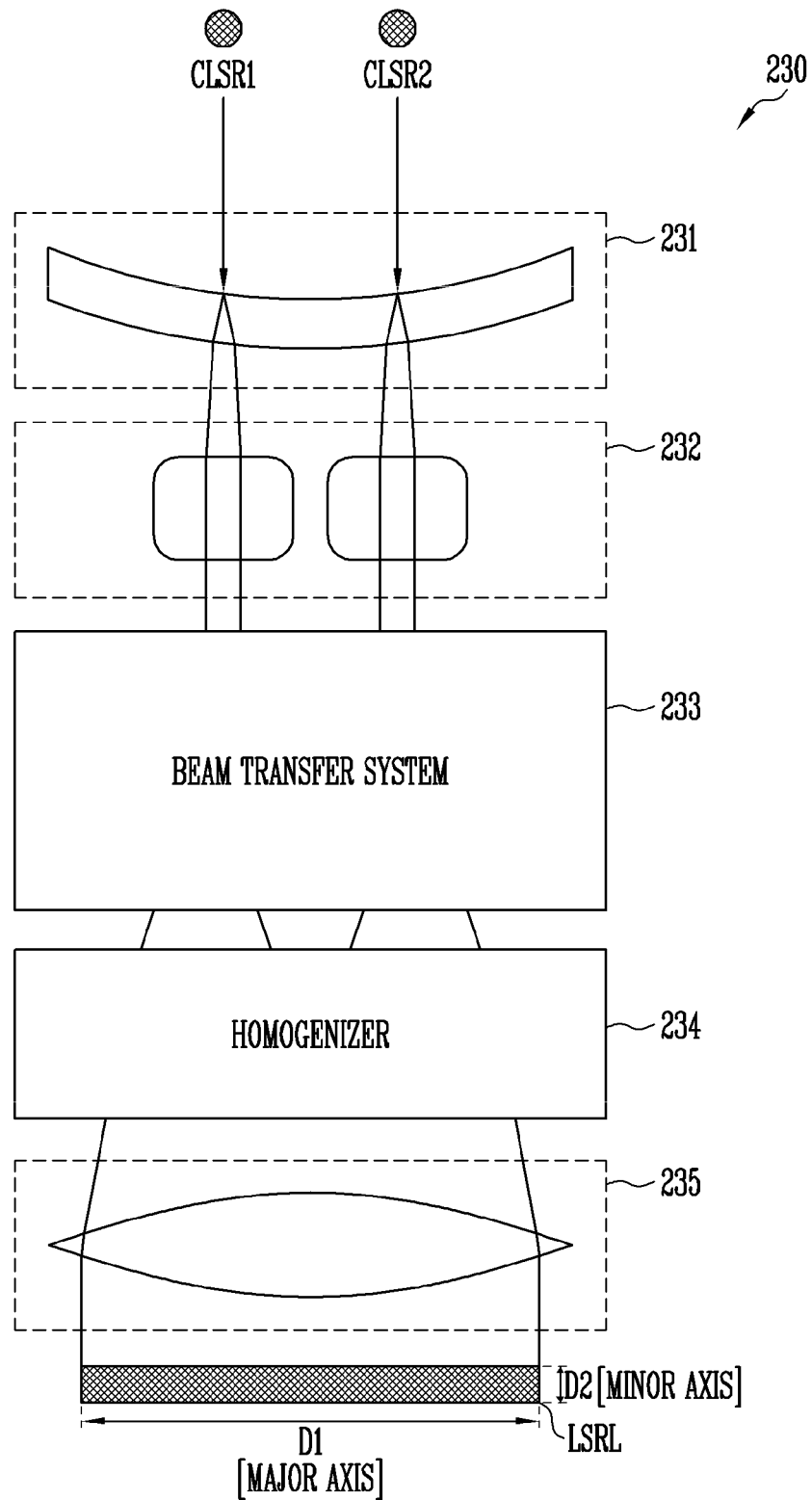
FIG. 4 is a diagram illustrating a photo molding machine according to an embodiment of the present disclosure.

FIG. 4 is a diagram illustrating a photo molding machine 230 according to an embodiment of the present disclosure.

Referring to FIG. 4, the photo molding machine 230 may include a telescope lens set 231, a cylinder lens 232, a beam transfer system 233, a homogenizer 234, and a condenser 235.

Although an embodiment in which the telescope lens set 231, the cylinder lens 232, the beam transfer system 233, and the homogenizer 234 are implemented with a lens is illustrated in FIG. 4, the present disclosure is not limited thereto. In some embodiments, the telescope lens set 231, the cylinder lens 232, the beam transfer system 233, and the homogenizer 234 may be implemented using at least one of a lens or a mirror.

The telescope lens set 231 may diffuse a first mixed laser beam CLSR1 and a second mixed laser beam CLSR2, which are supplied thereto. The first mixed laser beam CLSR1 and the second mixed laser beam CLSR2 may have a circular shape. Although a case where the telescope lens set 231 has one lens is illustrated in FIG. 4, the present disclosure is not limited thereto. In some embodiments, the telescope lens set 231 may include two or more lenses.

The cylinder lens 232 may adjust a beam input from the telescope lens set 231. For example, the cylinder lens 232 may adjust the beam width of the input beam to have narrow width.

The beam transfer system 233 may adjust a beam input from the cylinder lens 232. For example, the beam transfer system 233 may rotate the input beam to change a direction of the input beam.

The homogenizer 234 may homogenize the diffused first and second mixed laser beams CLSR1 and CLSR2.

In some embodiments, the beam transfer system 233 and the homogenizer 234 may include a saw tooth lens or a light guide having mirrors. Also, the homogenizer 232 may include a fly's eye lens.

The condenser 235 may condense the homogenized first and second mixed laser beams CLSR1 and CLSR2 in a desired shape. Consequently, the condenser 235 may generate an output beam LSRL. The output beam LSRL may have a linear shape having a major axis length D1 and a minor axis length D2.

Figure 5:
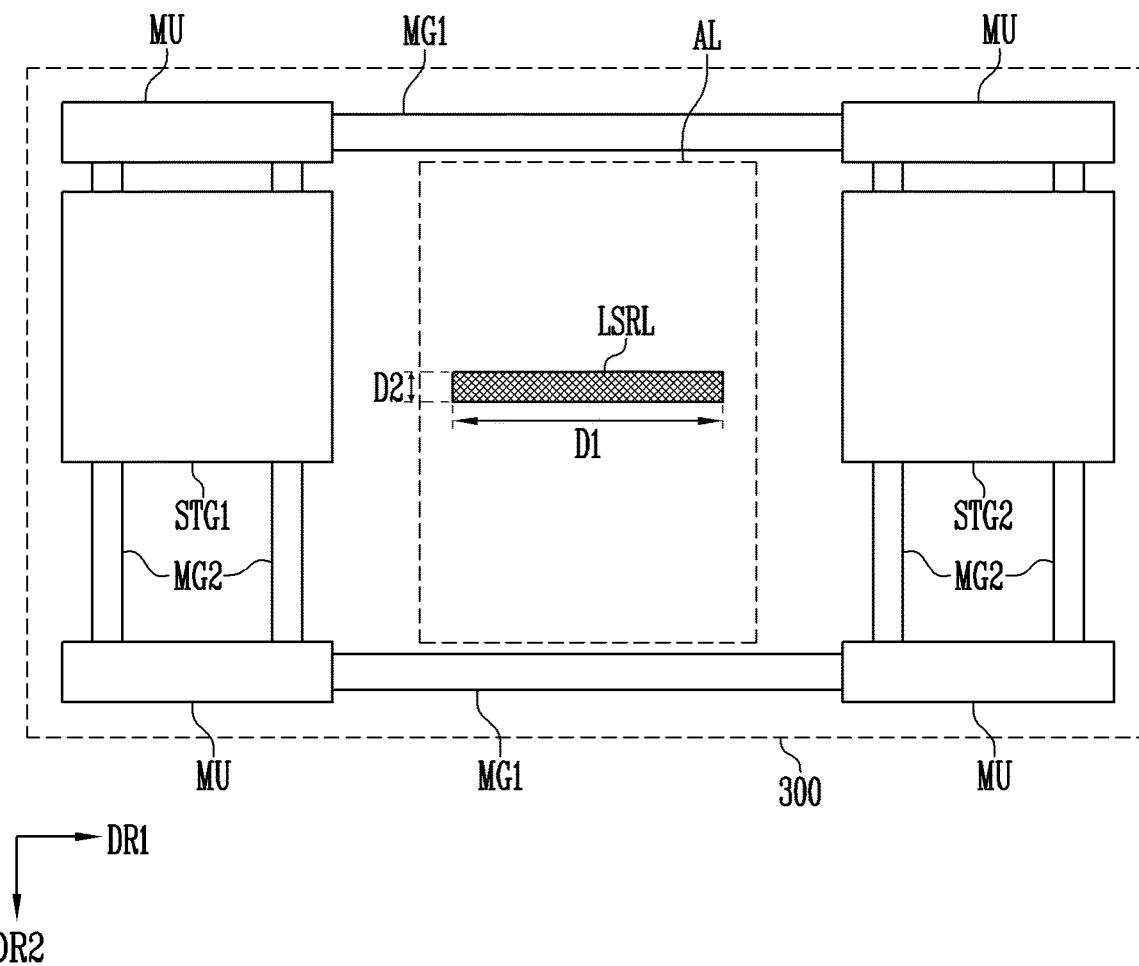
FIG. 5 is a diagram illustrating a substrate stage according to an embodiment of the present disclosure.

FIG. 5 is a diagram illustrating a substrate stage 300 according to an embodiment of the present disclosure. FIG. 5 illustrates a plan view of the substrate stage 300 according to the embodiment of the present disclosure.

The substrate stage 300 having two stages is representatively illustrated in FIG. 5. Contents described below may be properly modified to be applied to a substrate stage having one stage.

For convenience of description, a carrier substrate and a display device, which are disposed on the front of a first stage STG1 and a second stage STG2, are omitted in FIG. 5.

Referring to FIG. 5, the substrate stage 300 may include a first moving guide MG1, a second moving guide MG2, moving unit MU, the first stage STG1, and the second stage STG2.

The first moving guide MG1 may be disposed on the bottom of the substrate stage 300. The first moving guide MG1 may extend along a first direction DR1. The first moving guide MG1 may have guides disposed on the bottom of the substrate stage 300 and on the top of the substrate stage 300. The first moving guides MG1 may be arranged along a second direction DR2 different from the first direction DR1.

The moving units MU may be disposed on the first moving guide MG1. The moving units MU may move along the first moving guide MG1.

Although a case where four moving units MU are disposed at respective corners of the substrate stage 300 is illustrated in FIG. 5, the present disclosure is not limited thereto. In some embodiments, the number of moving units MU may be variously designed.

The moving units MU opposite to each other along the second direction may be coupled to each other through the second moving guides MG2. The second moving guides MG2 may extend along the second direction DR2. The second moving guides MG2 may be arranged along the first direction DR1.

The first stage STG1 and the second stage STG2 may be disposed on the second moving guides MG2. Also, the first stage STG1 and the second stage STG2 may be disposed between the moving units MU. For example, the first stage STG1 may be disposed at one side of the substrate stage 300 and the second stage STG2 may be disposed at the other side of the substrate stage 300. The first stage STG1 and the second stage STG2 may move along the second moving guide MG2.

A detailed operation of the substrate stage 300 is described below.

First, the moving unit MU at both sides of the first stage STG1 may move along the first moving guide MG1 such that the first stage STG1 is loaded in a laser area AL.

The laser area AL may be an area into which an output beam LSRL is incident.

As described in FIG. 4, in some embodiments, the output beam LSRL may have a linear shape having a major axis length D1 and a minor axis length D2.

During the first stage STG1 is loaded in the laser area AL, the output beam LSRL may be incident onto the back of a carrier substrate CST (see FIG. 6) disposed on the first stage STG1. Detailed contents related to this will be described with reference to FIG. 7.

While the output beam LSRL is incident, the first stage STG1 may move in the second direction DR2. Accordingly, the output beam LSRL can be uniformly incident onto the back of the carrier substrate CST (see FIG. 6) disposed on the first stage STG1. Consequently, a panel substrate PST (see FIG. 6) can be ablated from the carrier substrate CST (see FIG. 6). Detailed contents related to this will be described with reference to FIGS. 8A to 8C.

While the ablation with respect to the first stage STG1 is being performed, another carrier substrate may be disposed on the second stage STG2.

When the ablation with respect to the first stage STG1 is finished, the moving units MU at both sides of the first stage STG1 may move along the first moving guide MG1 such that the first stage STG1 is unloaded from the laser area AL. In addition, the moving units MU at both sides of the second stage STG2 may move along the first moving guide MG1 such that the second stage STG2 is loaded in the laser area AL.

While the ablation with respect to the second stage STG is being performed, a new carrier substrate may be disposed on the first stage STG1.

The operation may be repeatedly performed alternately on the first stage STG1 and the second stage STG2. Thus, in the laser ablation apparatus and a method of manufacturing a display device according to the embodiment of the present disclosure, productivity of the laser ablation apparatus can be improved.

Figure 6:
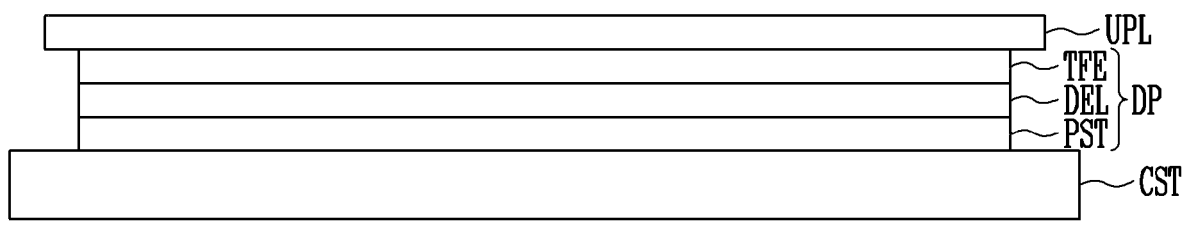
FIG. 6 is a diagram illustrating a carrier substrate and a display device according to an embodiment of the present disclosure.

FIG. 6 is a diagram illustrating a carrier substrate CST and a display device DP according to an embodiment of the present disclosure.

Referring to FIG. 6, the display device DP may include a panel substrate PST, a display element layer DEL, and a thin film encapsulation layer TFE.

First, the carrier substrate CST may be provided. The carrier substrate CST may be made of a rigid material to serve as a supporter in a process of manufacturing the display device DP of the present disclosure. The carrier substrate CST is made of a transparent material since a beam can be transmitted through the carrier substrate CST in a subsequent ablation process. For example, the carrier substrate CST may be made of glass using $SiO_2$ as a main component. In addition, the carrier substrate CST may be made of at least one of borosilicate glass, fused silica glass, and quartz glass.

The panel substrate PST may be formed and disposed on the front of the carrier substrate CST.

In some embodiments, the panel substrate PST may be a flexible substrate.

The panel substrate PST may be formed of a plastic material that is light due to low specific gravity and can be realized as a curved surface, as compared with the existing substrates made of glass. For example, the panel substrate PST may be formed of polyamide or polyimide that has excellent thermal resistance to endure a high-temperature process such as a low temperature poly silicon (LTPS) preparing process and has flexibility when it is formed in a film form. The panel substrate PST may be formed by coating a polyamide or polyimide solution on the carrier substrate CST through spin coating and then curing the coated polyamide or polyimide solution. Alternatively, the panel substrate may be formed by attaching a film-type polyamide or polyimide substrate to the carrier substrate CST, using an adhesive material or by laminating the film-type polyamide or polyimide substrate on the carrier substrate CST.

The display element layer DEL may be formed on the front of the panel substrate PST.

Although not shown in the drawing, the display element layer DEL may include a light emitting element, a circuit element for driving the same, and the like. However, the present disclosure is not limited thereto, and the light emitting element may include various display elements such as a liquid crystal element and an electrophoretic element, in addition to the organic light emitting element.

The thin film encapsulation layer TFE may be formed on the front of the display element layer DEL. The thin film encapsulation layer TFE may encapsulate the display element layer DEL.

The thin film encapsulation layer TFE may be in the form of a thin film or multi-layer. For example, the thin film encapsulation layer TFE may have a structure in which a layer made of an inorganic material such as silicon oxide (SiOx) or silicon nitride (SiNx) and a layer made of an organic material such as epoxy or polyimide are alternately stacked. However, the present disclosure is not limited thereto, and the thin film encapsulation layer TFE may include a layer made of low melting glass.

The display device DP may include the panel substrate PST, the display element layer DEL, and the thin film encapsulation layer TFE.

An upper protective layer UPL may be formed and disposed on the front of the thin film encapsulation layer TFE.

After the display device DP is completed, the panel substrate PST of the display device DP may be ablated from the carrier substrate CST.

The upper protective layer UPL may prevent the thin film encapsulation layer TFE from being damaged while the panel substrate PST is being ablated from the carrier substrate CST.

The upper protective layer UPL may be removed after the panel substrate PST is ablated from the carrier substrate CST.

Figure 7:
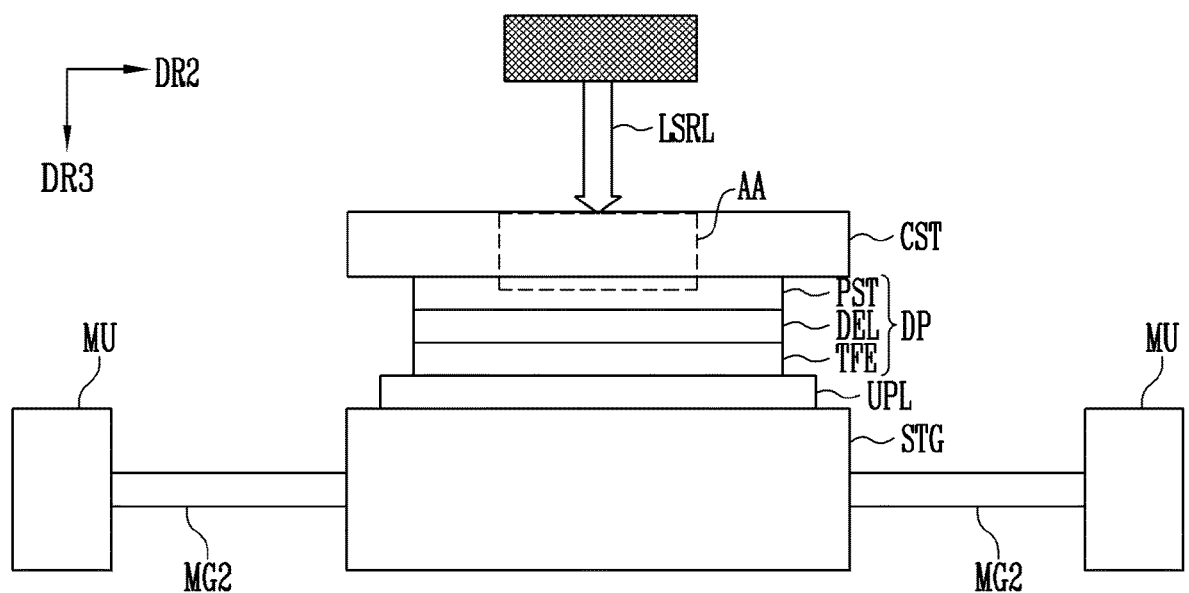
FIG. 7 is a diagram illustrating an operation of the laser ablation apparatus according to an embodiment of the present disclosure.
Figure 8A:
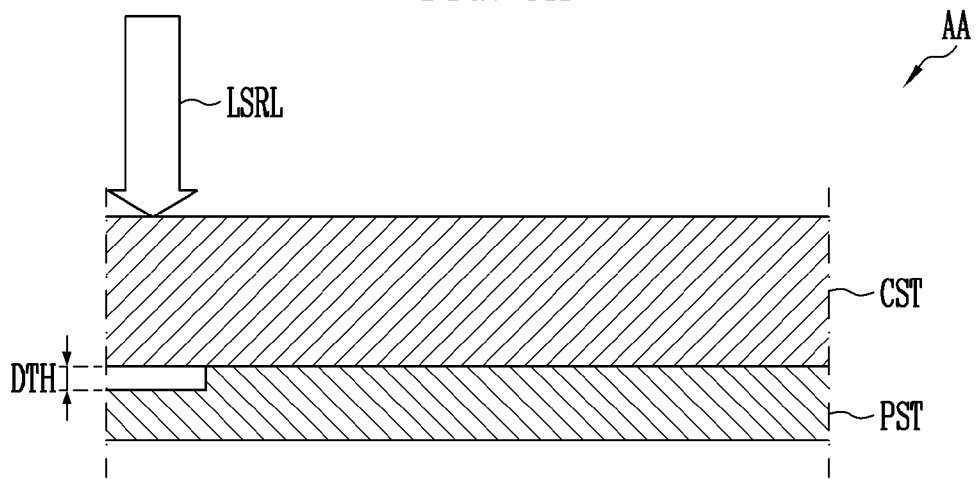
FIGS. 8A to 8C are diagrams illustrating an operation of the laser ablation apparatus according to an embodiment of the present disclosure.
Figure 8B:
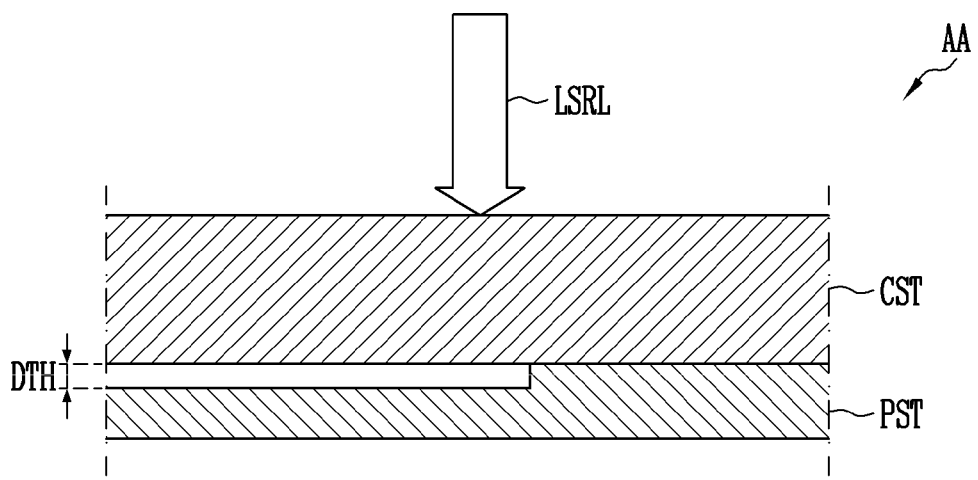
Figure 8C:
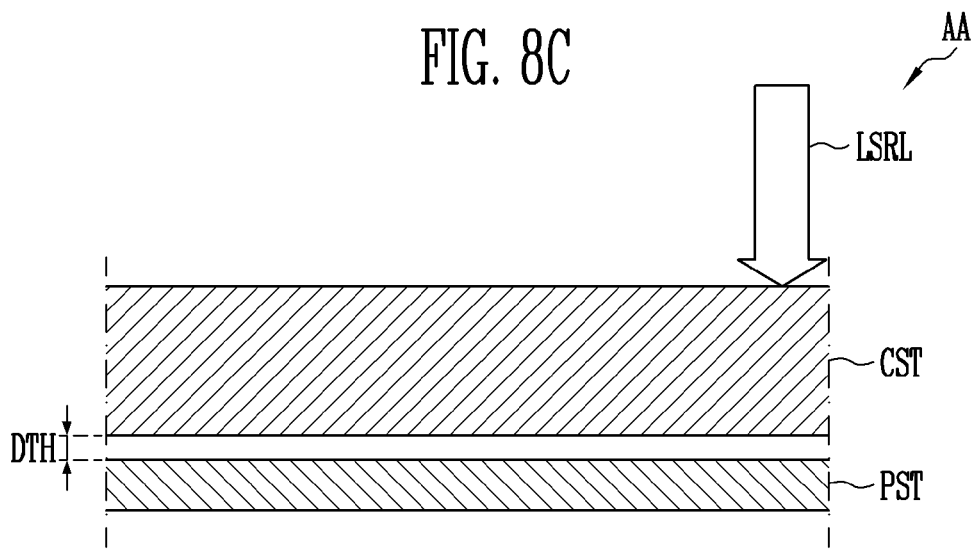

FIG. 7 is a diagram illustrating an operation of the laser ablation apparatus according to an embodiment of the present disclosure. FIGS. 8A to 8C are diagrams illustrating an operation of the laser ablation apparatus according to an embodiment of the present disclosure.

FIG. 7 illustrates a sectional view of the substrate stage 300 according to the embodiment of the present disclosure.

Referring to FIGS. 7 and 8A to 8C, the carrier substrate CST may be provided on a stage STG. The stage STG shown in FIG. 7 may correspond to any one of the first and second stages STG1 and STG2 shown in FIG. 5.

For example, the carrier substrate CST may be disposed on the state STG in a state in which it is overturned such that its front faces the bottom and its back faces the top. That is, the carrier substrate CST may be disposed on the stage STG such that the upper protective layer UPL formed on the front of the display device DP is in contact with the stage STG.

In order for the panel substrate PST to be ablated from the carrier substrate CST, an output beam LSRL having a predetermined energy density may be incident onto the back of the carrier substrate CST.

If the output beam LSRL is incident onto the front of the display device DP on which the upper protective layer UPL is disposed, the display element layer DEL of the display device DP may be damaged. In order to prevent this, the output beam LSRL is incident onto the back of the carrier substrate CST.

In some embodiments, the output beam LSRL may be incident onto the back of the carrier substrate CST.

While the output beam LSRL is incident, the stage STG may move along the second moving guide MG2.

FIGS. 8A to 8C illustrates in detail a contact area AA while the stage STG is moving in the second direction DR2.

A portion of the panel substrate PST, which is in contact with the carrier substrate CST, may absorb a beam having a predetermined energy density from the output beam LSRL.

When the absorbed energy exceeds a specific level, coupling rings of polyamide or polyimide, which constitute the panel substrate PST, may be broken.

When the coupling rings are broken, thermal evaporation, bursting plasma or sonic wave may occur. The panel substrate PST may be removed by a beam penetration depth DTH from a surface of the panel substrate PST, which is in contact with the carrier substrate CST.

In some embodiments, the panel substrate PST may be designed such that its thickness is larger than the beam penetration depth DTH.

The beam penetration depth DTH may be calculated using Equation 1

$$DTH = L/(4*\pi*k) \qquad \text{Equation 1}$$

DTH denotes the beam penetration depth, L denotes the wavelength of a beam, and k denotes the beam absorption coefficient of the panel substrate PST.

Thus, the panel substrate PST can be ablated from the carrier substrate CST.

Figure 9:
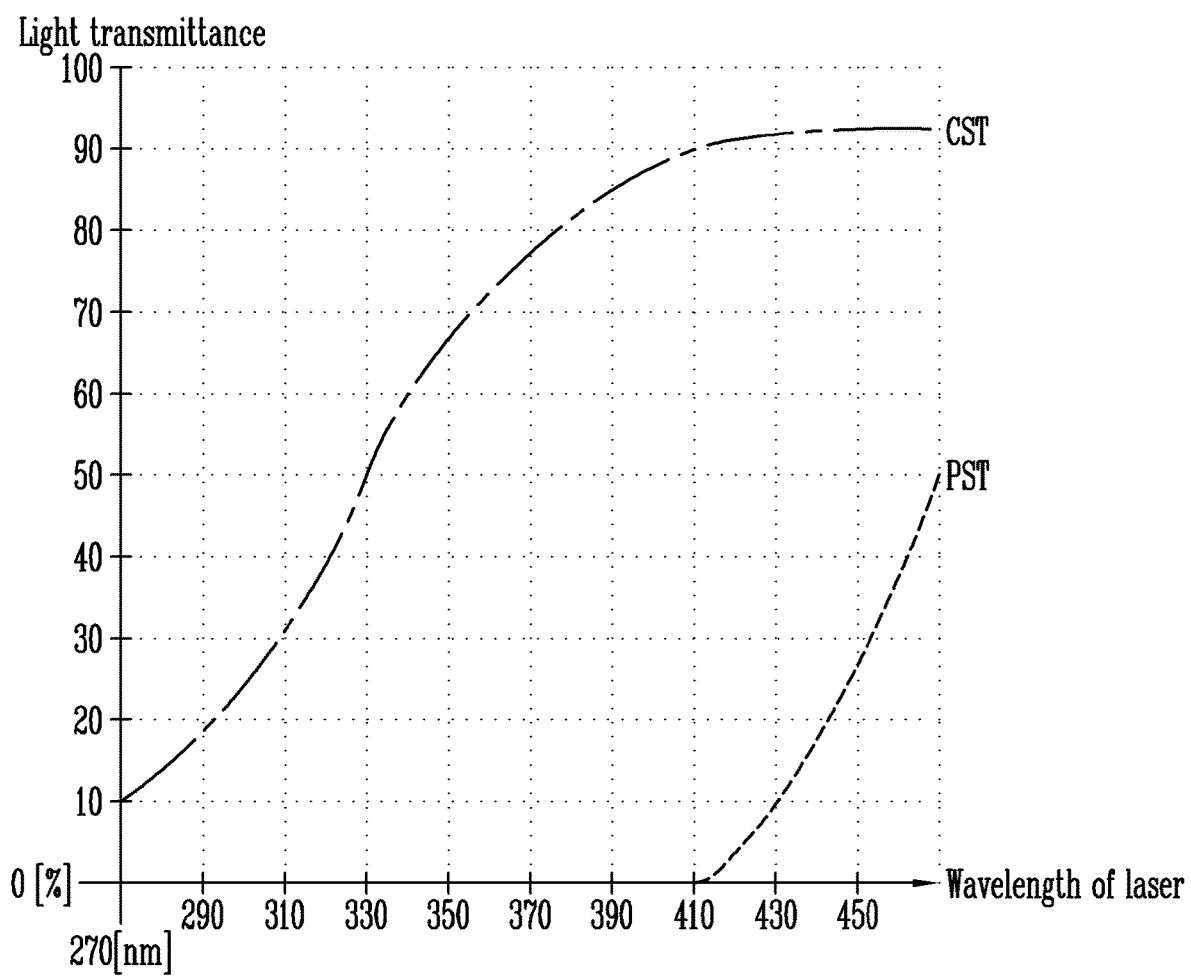
FIG. 9 is a graph illustrating light transmittance of a panel substrate and a carrier substrate according to wavelength of laser.

FIG. 9 is a graph illustrating light transmittance of the panel substrate and the carrier substrate according to wavelength of laser.

Referring to FIG. 9, the light transmittance of the carrier substrate CST is 10% or less in a section in which the wavelength of the laser is 270 nm or less. The light transmittance of the carrier substrate CST gradually increases in a section in which the wavelength of the laser ranges from 270 nm to 410 nm. The light transmittance of the carrier substrate CST is 90% or more in a section in which the wavelength of the laser is 410 nm or more.

The light transmittance of the panel substrate PST is substantially 0% in a section in which the wavelength of the laser is 410 nm or less. The light transmittance of the panel substrate PST gradually increases in a section in which the wavelength of the laser exceeds 410 nm.

The wavelength of the laser may be selected from 270 nm to 410 nm such that the panel substrate PST is efficiently ablated from the carrier substrate CST and the display element layer DEL of the display device DP may not be damaged by the laser.

Figure 10:
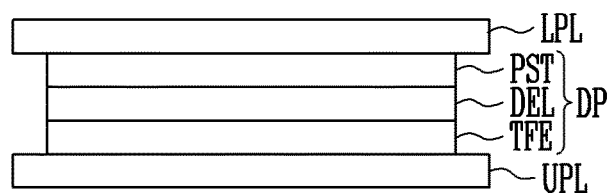
FIG. 10 is a diagram illustrating a display device according to an embodiment of the present disclosure.

FIG. 10 is a diagram illustrating a display device DP according to an embodiment of the present disclosure.

FIG. 10 illustrates the display device DP after the panel substrate PST is ablated from the carrier substrate CST.

Referring to FIG. 10, the ablated carrier substrate CST may be detached from the display device DP.

Subsequently, a lower protective layer LPL may be formed and disposed on the back of the panel substrate PST. Like the upper protective layer UPL, the lower protective layer LPL may prevent the display device DP from being damaged, and function to support the display device DP while the display device DP is transferred during a manufacturing process.

Figure 11:
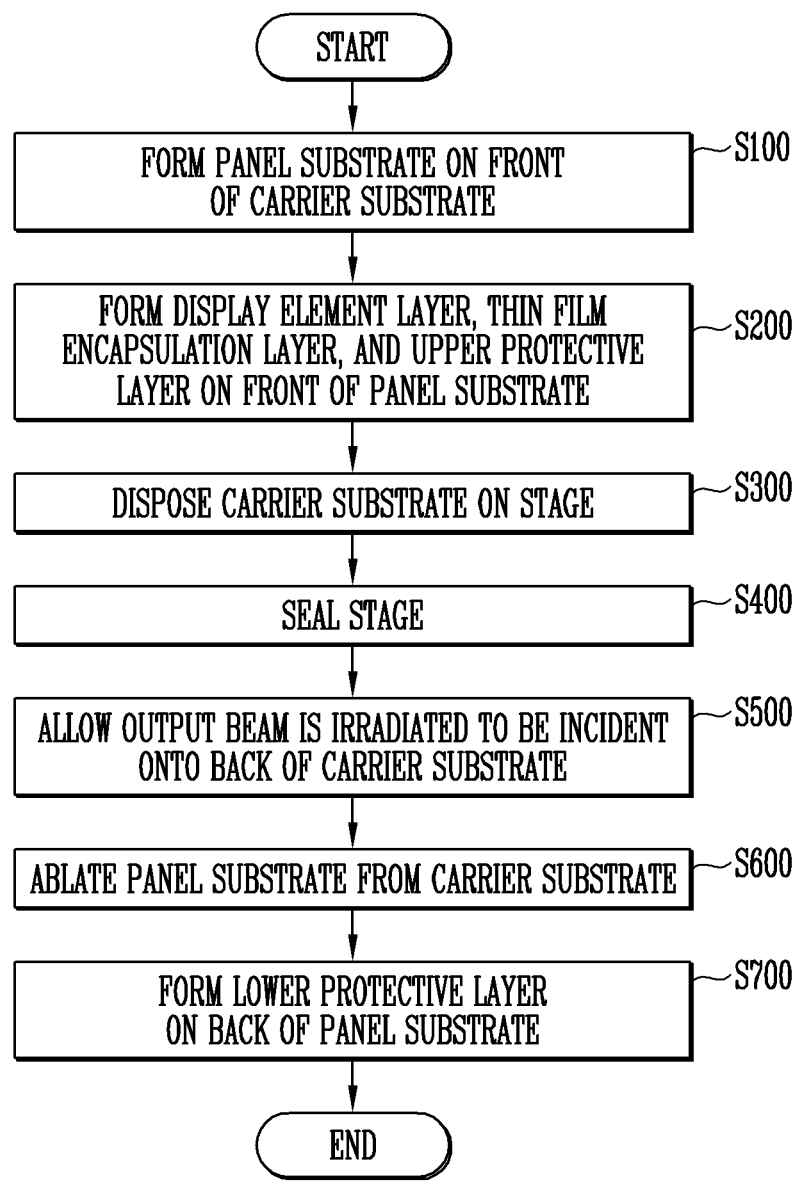
FIG. 11 is a diagram illustrating a method of manufacturing of the display device according to an embodiment of the present disclosure.

FIG. 11 is a diagram illustrating a method of manufacturing of the display device DP according to an embodiment of the present disclosure.

Referring to FIGS. 1 to 11, first, a carrier substrate CST may be provided.

The carrier substrate CST may be made of a rigid material to sever as a support in a process of manufacturing the display device DP of the present disclosure.

The panel substrate PST may be formed on the front of the carrier substrate CST (S100). In some embodiments, the panel substrate PST may be a flexible substrate.

A display element layer DEL, a thin film encapsulation layer TFE, and an upper protective layer UPL may be sequentially formed on the front of the panel substrate PST (S200).

Although not shown in the drawing, the display element layer DEL may include a light emitting element, a circuit element for driving the same, and the like. The thin film encapsulation layer TFE may encapsulate the display element layer DEL.

The upper protective layer UPL may prevent the thin film encapsulation layer TFE from being damaged while the panel substrate PST is being ablated from the carrier substrate CST.

The carrier substrate CST may be disposed on a stage STG (S300).

For example, the carrier substrate CST may be disposed on the state STG in a state in which it is overturned such that its front faces the bottom and its back faces the top. That is, the carrier substrate CST may be disposed on the stage STG such that the upper protective layer UPL formed on the front of the display device DP is in contact with the stage STG.

The stage STG may be sealed by the chamber 400 (S400).

The chamber 400 may seal at least one stage from the outside so as to prevent ozone gas generated during the ablation from being released to the outside.

An output beam LSRL may be irradiated onto the back of the carrier substrate CST (S500).

When the output beam LSRL is incident onto the front of the carrier substrate CST, the display element layer DEL of the display device DP may be damaged. In order to prevent this, the output beam LSRL is incident onto the back of the carrier substrate CST.

In some embodiments, the output beam LSRL may be incident onto the back of the carrier substrate CST.

The panel substrate PST may be ablated from the carrier substrate CST (S600).

A portion of the panel substrate PST, which is in contact with the carrier substrate CST, may absorb a beam having a predetermined energy density from the output beam LSRL.

When the absorbed energy exceeds a specific level, coupling rings of polyamide or polyimide, which constitute the panel substrate PST, may be broken.

When the coupling rings are broken, thermal evaporation, bursting plasma or sonic wave may occur. The panel substrate PST may be removed by a beam penetration depth DTH from a surface of the panel substrate PST, which is in contact with the carrier substrate CST.

A lower protective layer LPL may be formed on the back of the panel substrate PST (S700).

Like the upper protective layer UPL, the lower protective layer LPL may prevent the display device DP from being damaged, and function to support the display device DP during the manufacturing process.

Figure 12:
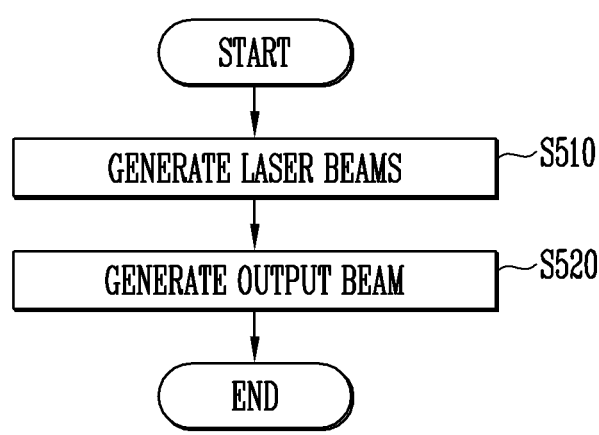
FIG. 12 is a diagram illustrating a method of manufacturing of the display device according to an embodiment of the present disclosure.

FIG. 12 is a diagram illustrating a method of manufacturing of the display device DP according to an embodiment of the present disclosure.

FIG. 12 illustrates in detail the step S500 shown in FIG. 11.

Referring to FIGS. 1 to 12, laser beams LSR may be generated (S510). The laser beam generator 100 may generate the laser beams LSR using a solid-state laser.

An output beam LSRL may be generated (S520). The output beam generator 200 may generate the output beam LSRL using the laser beams LSR.

In the laser ablation apparatus and the method of manufacturing the display device according to the embodiment of the present disclosure, performance and productivity can be improved, and maintenance cost can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A laser ablation apparatus comprising:
a laser beam generator including beam sources for generating laser beams, the laser beam generator using a solid-state laser;
an output beam generator configured to generate an output beam using the laser beams; and
a substrate stage including at least one stage in which a carrier substrate on which a panel substrate is formed is disposed,
wherein the output beam generator includes:
mixers configured to generate mixed laser beams having a plurality of linear-polarizations which intersect at a predetermined angle by mixing the laser beams; and
a photo molding machine configured to generate the output beam using the mixed laser beams,
wherein the laser beams include first laser beams and second laser beams, and
wherein the mixers rotate a polarization direction of the first laser beams by the predetermined angle and mix the first laser beams having a rotated polarization direction and the second laser beams to generate the mixed laser beams.

2. The laser ablation apparatus of claim 1, wherein the substrate stage includes a plurality of stages.

3. The laser ablation apparatus of claim 2, wherein the substrate stage further includes a moving unit configured to move the plurality of stages to a laser incident area along a first moving guide,
wherein the plurality of stages move along a second moving guide in the laser incident area while the output beam is incident,
wherein the first moving guide extends along a first direction, and
the second moving guide extends along a second direction different from the first direction.

4. The laser ablation apparatus of claim 1, further comprising a chamber configured to seal the at least one stage from the outside.

5. The laser ablation apparatus of claim 1, wherein the photo molding machine includes a homogenizer configured to homogenize the mixed laser beams.

6. The laser ablation apparatus of claim 1, wherein the output beam is configured to be incident onto the back of the carrier substrate.

7. The laser ablation apparatus of claim 1, wherein the output beam has a linear shape.

8. The laser ablation apparatus of claim 1, wherein the panel substrate includes polyamide or polyimide.

9. The laser ablation apparatus of claim 1, wherein the beam sources include a laser including an ytterbium:yttrium aluminum garnet (Yb:YAG) component.

10. The laser ablation apparatus of claim 1, wherein the wavelength of the laser beams belongs to a range of 270 nm to 410 nm.

11. The laser ablation apparatus of claim 1, wherein the laser beam generator includes even numbered beam sources.

12. The laser ablation apparatus of claim 11, wherein the laser beam generator includes four beam sources.

13. A method of manufacturing a display device, the method comprising:
forming a panel substrate on the front of a carrier substrate;
forming a display element layer, a thin film encapsulation layer, and an upper protective layer on the front of the panel substrate;
disposing the carrier substrate on a stage in a state in which the carrier substrate is overturned;
irradiating, by an output beam generator, an output beam onto the back of the carrier substrate; and
ablating the panel substrate from the carrier substrate, wherein the irradiating the output beam includes:
generating, by a laser beam generator, laser beams, using a solid-state laser; and
generating, by the output beam generator, the output beam using the laser beams.

14. The method of claim 13, wherein the output beam generator includes:
mixers configured to generate mixed laser beams having two linear-polarizations orthogonal to each other by mixing the laser beams; and
a photo molding machine configured to generate the output beam using the mixed laser beams.

15. The method of claim 13, further comprising sealing, by a chamber, the stage from the outside.

16. The method of claim 13, further comprising forming a lower protective layer on the back of the panel substrate.

17. The method of claim 13, wherein the laser beam generator includes a laser including an ytterbium:yttrium aluminum garnet (Yb:YAG) component.

18. The method of claim 13, wherein the output beam is incident onto the back of the carrier substrate along a normal direction.

19. The method of claim 13, wherein the laser beam generator includes four beam sources.

* * * * *